United States Patent
Zhuang et al.

(10) Patent No.: US 11,879,934 B2
(45) Date of Patent: Jan. 23, 2024

(54) TEST KIT FOR TESTING A DEVICE UNDER TEST

(71) Applicant: MEDIATEK INC., Hsin-Chu (TW)

(72) Inventors: Jing-Hui Zhuang, Hsinchu (TW); Ying-Chou Shih, Hsinchu (TW); Sheng-Wei Lei, Hsinchu (TW); Chang-Lin Wei, Hsinchu (TW); Chih-Yang Liu, Hsinchu (TW); Che-Hsien Huang, Hsinchu (TW); Yi-Chieh Lin, Hsinchu (TW)

(73) Assignee: MEDIATEK INC., Hsin-Chu (TW)

(*) Notice: Subject to any disclaimer, the term of this patent is extended or adjusted under 35 U.S.C. 154(b) by 0 days.

(21) Appl. No.: 17/735,130

(22) Filed: May 3, 2022

(65) Prior Publication Data
US 2022/0397600 A1 Dec. 15, 2022

Related U.S. Application Data

(60) Provisional application No. 63/209,451, filed on Jun. 11, 2021.

(51) Int. Cl.
*G01R 31/28* (2006.01)
*G01R 31/66* (2020.01)
*G01R 31/26* (2020.01)

(52) U.S. Cl.
CPC ......... *G01R 31/2886* (2013.01); *G01R 31/26* (2013.01); *G01R 31/66* (2020.01); *G01R 31/2893* (2013.01)

(58) Field of Classification Search
CPC .... G01R 31/2886; G01R 31/26; G01R 31/66; G01R 31/2893; G01R 1/07378; G01R 1/045; G01R 29/0814; G01R 29/0878
See application file for complete search history.

(56) References Cited

U.S. PATENT DOCUMENTS

| | | | |
|---|---|---|---|
| 2009/0153158 A1* | 6/2009 | Dunn | G01R 31/2822 324/762.01 |
| 2012/0105089 A1* | 5/2012 | Song | H01L 22/32 324/755.05 |
| 2015/0070622 A1* | 3/2015 | Christophy | G06F 1/1656 361/220 |
| 2020/0300890 A1* | 9/2020 | Kawashima | H01L 23/49811 |
| 2021/0011069 A1* | 1/2021 | Chen | G01R 31/2896 |
| 2021/0033668 A1 | 2/2021 | Trotta | |
| 2021/0072307 A1* | 3/2021 | Fang | G01R 31/2887 |

FOREIGN PATENT DOCUMENTS

| | | |
|---|---|---|
| EP | 4 102 235 A1 | 12/2022 |
| TW | 201944082 A | 11/2019 |
| TW | 202109062 A | 3/2021 |
| TW | 202111343 A | 3/2021 |
| WO | 2008/100101 A1 | 8/2008 |

\* cited by examiner

*Primary Examiner* — Akm Zakaria
(74) *Attorney, Agent, or Firm* — Winston Hsu

(57) ABSTRACT

A test kit for testing a device under test (DUT) includes a socket structure for containing the DUT, and a plunger assembly detachably coupled with the socket structure. The plunger assembly includes a multi-layered structure having at least an interposer substrate sandwiched by a top socket and a nest.

21 Claims, 8 Drawing Sheets

TEST KIT FOR TESTING A DEVICE UNDER TEST

CROSS REFERENCE TO RELATED APPLICATIONS

This application claims priority from U.S. provisional application No. 63/209,451 filed on Jun. 11, 2021, the disclosure of which is included in its entirety herein by reference.

BACKGROUND

This invention relates generally to the field of semiconductor testing. More particularly, this invention relates to an improved test kit for testing electronic devices or modules.

Millimeter wave (mmW) communication systems have attracted significant interest regarding meeting the capacity requirements of the 5G network. Transmitting at the mmW frequency bands places high demands on testing electronic devices to ensure that the transmission and receiving circuitry is operating correctly. In order to inspect the electrical properties of a device under test (DUT), the DUT is stably electrically connected to a test apparatus. In general, a test socket is used as a tool for electrically connecting the DUT and the test apparatus.

Drawbacks of current testing systems include longer test times and large physical size of test systems. Further, it is difficult to test a DUT that is able to transmit mmW signals on both its bottom side and top side because the conventional plastic plunger, which is designed to pick and place the DUT in a socket, cannot capture or transmit mmW signals. It is desired to have a reliable and cost effective test system for testing mmW devices in high volumes.

SUMMARY

It is one object of the invention to provide an improved test kit for testing a DUT to solve the above-mentioned deficiencies or shortcomings.

According to one aspect of the invention, a test kit for testing a device under test (DUT) includes a socket structure for containing the DUT, and a plunger assembly detachably coupled with the socket structure. The plunger assembly includes a multi-layered structure having at least an interposer substrate sandwiched by a top socket and a nest.

According to some embodiments, the plunger assembly further comprises a pressing member coupled to an upper side of the nest.

According to some embodiments, the pressing member is made of metal.

According to some embodiments, the socket structure comprises a bottom socket and a socket base secured to the bottom socket.

According to some embodiments, the socket base comprises a central through hole that allows passage of the DUT and a lower portion of the plunger assembly that vacuum grips the DUT and places the DUT to test site on the socket structure.

According to some embodiments, the socket base comprises an inner portion around an upper surface of the bottom socket, and wherein a lower portion of the nest is engaged and in direct contact with the inner portion of the socket base.

According to some embodiments, the nest is made of an electrostatic-discharge (ESD) control material or a static-dissipative material.

According to some embodiments, the test kit for testing a DUT further includes at least one nozzle for vacuum gripping or holding the DUT. The at least one nozzle penetrates through the nest, the interposer substrate and the top socket.

According to some embodiments, the at least one nozzle communicates with a connecting chamber disposed between the nest and the pressing member.

According to some embodiments, the top socket comprises s a plurality of pogo pins for electrically connecting the interposer substrate to the DUT.

According to one aspect of the invention, a test kit for testing a device under test includes a socket structure for containing the DUT, and a plunger assembly detachably coupled with the socket structure. The plunger assembly includes a multi-layered structure having a top socket, at least an interposer substrate mounted on the top socket, a nest, and a reflector disposed between the interposer substrate and the nest.

According to some embodiments, the interposer substrate comprises an antenna structure on its top side that directly faces the reflector.

According to some embodiments, the reflector is spaced a distance d apart from the interposer substrate.

According to some embodiments, a RF signal can be transferred from one antenna to an adjacent antenna of the antenna structure via reflection of the reflector such that a non-conductive loopback test is implemented in the plunger assembly.

According to some embodiments, the reflector is composed of a conductive material.

According to some embodiments, the plunger assembly further comprises a pressing member coupled to an upper side of the nest.

According to some embodiments, the pressing member is made of metal.

According to some embodiments, the socket structure comprises a bottom socket and a socket base secured to the bottom socket.

According to some embodiments, the socket base comprises a central through hole that allows passage of the DUT and a lower portion of the plunger assembly that vacuum grips the DUT and places the DUT to test site on the socket structure.

According to some embodiments, the socket base comprises an inner portion around an upper surface of the bottom socket. A lower portion of the nest is engaged and in direct contact with the inner portion of the socket base.

According to some embodiments, the nest is made of an electrostatic-discharge (ESD) control material or a static-dissipative material.

According to some embodiments, the test kit for testing a DUT further comprises at least one nozzle for vacuum gripping or holding the DUT, wherein the at least one nozzle penetrates through the nest, the reflector, the interposer substrate and the top socket.

According to some embodiments, the top socket comprises s a plurality of pogo pins for electrically connecting the interposer substrate to the DUT.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the invention and are incorporated in and constitute a part of this specification. The drawings illustrate embodiments of the invention and, together with the description, serve to explain the principles of the invention. In the drawings.

DETAILED DESCRIPTION

Figure 1:
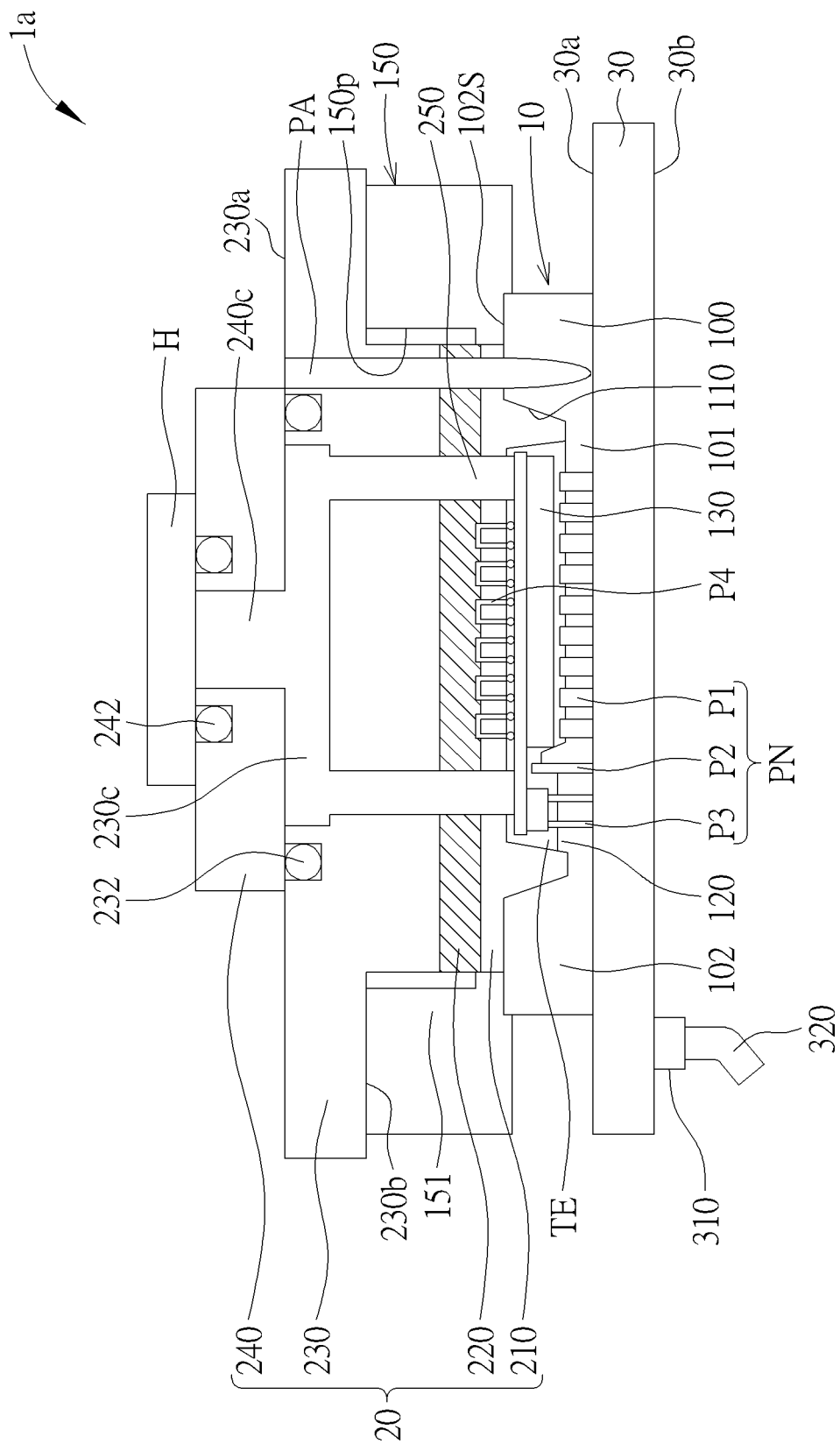
FIG. 1 is a schematic, cross-sectional diagram showing a test kit for testing a DUT according to an embodiment of the present invention.

In the following detailed description of embodiments of the invention, reference is made to the accompanying drawings, which form a part hereof, and in which is shown by way of illustration specific preferred embodiments in which the disclosure may be practiced. These embodiments are described in sufficient detail to enable those skilled in the art to practice them, and it is to be understood that other embodiments may be utilized and that mechanical, structural, and procedural changes may be made without departing from the spirit and scope of the present disclosure. The following detailed description is, therefore, not to be taken in a limiting sense, and the scope of embodiments of the present invention is defined only by the appended claims.

It will be understood that, although the terms first, second, third, primary, secondary, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first or primary element, component, region, layer or section discussed below could be termed a second or secondary element, component, region, layer or section without departing from the teachings of the present inventive concept.

Spatially relative terms, such as "beneath", "below", "lower", "under", "above," "upper," "over" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" or "over" the other elements or features. Thus, the exemplary terms "below" and "under" can encompass both an orientation of above and below. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items, and may be abbreviated as "/".

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on," "directly connected to", "directly coupled to", or "immediately adjacent to" another element or layer, there are no intervening elements or layers present.

It is noted that: (i) same features throughout the drawing figures will be denoted by the same reference label and are not necessarily described in detail in every drawing that they appear in, and (ii) a sequence of drawings may show different aspects of a single item, each aspect associated with various reference labels that may appear throughout the sequence, or may appear only in selected drawings of the sequence.

Wireless microelectronic devices usually undergo many kinds of tests in order to ensure sufficient performance and to verify their RF functionalities. Some tests are mandated by standards, while others are performed as part of product development and verification. When a radio frequency signal is transmitted from a transmitter to a receiver, the signal propagates in a radio channel along one or more paths having different angles of arrivals, signal delays, polarizations and powers, which cause fading of different durations and strengths in the received signal. In addition, noise and interference due to other transmitters interfere with the radio connection.

The present invention pertains to a wireless test system for testing microelectronic devices or modules. Embodiments of the present invention are directed to improvements in test kits utilized to hold and/or test a device under test (DUT). For example, a method of testing a DUT may include setting the DUT in a simultaneous transmit and receive mode; receiving a lower frequency radio frequency (RF) signal from a test unit; up-converting the lower frequency RF signal to a higher frequency RF signal; transmitting the higher frequency RF signal from the DUT to a circuit of an interposer substrate via a top socket; receiving the higher frequency RF signal through the top socket and the DUT; down-converting the received higher frequency RF signal to a received test RF signal; and providing the received test RF signal to the test unit.

A DUT is a term commonly used to refer to any electronic device or module undergoing any testing. The DUT is usually inserted into a test socket that is connected to an automatic test equipment (ATE) in semiconductor testing. An ATE is widely used in the manufacturing industry to test the various types of semiconductor devices such as packaged or un-packaged integrated circuit (IC) devices, antenna-in modules (AIMs), printed circuit boards (PCBs), etc.

The present disclosure is particularly suited for radiated testing of an RF microelectronic device or DUT that may be driven and/or sensed by RF transmitter and/or receiver circuitry and may operate in the range of, for example, 20 GHz to 300 GHz (millimeter wave frequencies), for example, in a frequency band around 24 GHz, 60 GHz, 77 GHz, or 79 GHz, but is not limited thereto. Depending upon design requirements, various circuits and components may be provided on the interposer substrate to achieve mmW signal loopback. The present disclosure not only reduces the transmission path length to avoid excessive lose, but also achieves mmW signal loopback technique at limited area.

Please refer to FIG. 1. FIG. 1 is a schematic, cross-sectional diagram showing a test kit for testing a DUT according to an embodiment of the present invention. As shown in FIG. 1, the test kit 1a comprises a socket structure 10 and a plunger assembly 20 detachably coupled with the socket structure 10. According to an embodiment of the present invention, the socket structure 10 may comprise a socket housing 100 secured to a load board 30 such as a printed wiring board or a printed circuit board. The load board 30 may also be referred to as a test board. Although not explicitly depicted, it is understood that the load board 30 typically comprises a core (e.g., FR4 copper clad laminate core), a plurality of dielectric build-up layers, and traces on opposite surfaces of the core. The traces in different levels of the printed circuit board may be electrically connected to one another by plated through vias or plated through holes. The circuitry on the load board 30 may be electrically connected to a test unit (not shown) comprising a signal generator configured to generate a test signal.

According to an embodiment of the present invention, the load board 30 may incorporate custom circuitry specific for testing a particular DUT. For example, the load board 30 may be a custom RF load board that has been modified especially for the radiated, electrical and physical characteristics of a particular DUT. According to an embodiment of the present invention, for example, the load board 30 may be electrically connected to an RF instrumentation circuitry by RF cables and/or connectors. It is understood that the load board 30 may also be connected to DC power, ground, digital inputs/outputs, and/or a computer, which are not shown for the sake of simplicity. For example, in FIG. 1, the load board includes a printed circuit board (PCB) having a DUT side 30a and a non-DUT side 30b. A DUT 130 is insertable to the socket structure 10 on the DUT side 30a. The non-DUT side 30b is accessible to one or more RF connectors 310 to which an RF cable 320 is connectable. Each RF connector 310 provides an RF connection to a tester.

According to an embodiment of the present invention, the socket housing 100 may be made of monolithic anti-static materials including, but not limited to, durable high-performance polyimide-based plastics, such as SP1+ (DuPont™) having a dielectric constant ($D_k$) of about 3.5, but is not limited thereto. According to an embodiment of the present invention, the socket housing 100 may comprise a plate-shaped base portion 101 integrated with a pin assembly PN including, but not limited to, pogo pins P1, conductive pins P2 and conductive pins P3. The conductive pins P2 and P3 may extend from the socket housing 100 and penetrate through corresponding through holes formed on the base portion 101 for transmitting signals. According to an embodiment of the present invention, the base portion 101 functions as an interface between the load board 30 and the DUT 130. According to an embodiment of the present invention, the pin assembly PN may comprise at least two different types and lengths of pogo pins.

According to an embodiment of the present invention, the socket housing 100 may comprises an annular perimeter structure 102 surrounding the base portion 101, thereby forming a cavity 110 defined by an inner sidewall of the annular perimeter structure 102 and an upper surface of the base portion 101. According to an embodiment of the present invention, the annular perimeter structure 102 is formed integrally with the base portion 101. According to an embodiment of the present invention, the annular perimeter structure 102 has a thickness that is greater than a thickness of the base portion 101. According to another embodiment of the present invention, the socket housing 100 may be in direct contact with the load board 30. However, the socket housing 100 may be partially removed while the socket housing 100 is overlapping any high frequency signal traces on the load board 30. According to an embodiment of the present invention, an electrically floating guide plate 120 for guiding and adjusting the position and/or rotation angles of the DUT 130 may be fittingly mounted within the cavity 110. The guide plate 120 may be in direct contact with the socket housing 100.

According to an embodiment of the present invention, the guide plate 120 may be made of monolithic electrostatic-discharge (ESD) control materials or static-dissipative materials to prevent the DUT 130 from being damaged under high electrostatic voltages during the testing process. For example, the aforesaid ESD control materials or static-dissipative materials may include, but not limited to, polyether ether ketone (PEEK)-based plastics, such as EKH-SS11 (Krefine®) having a dielectric constant of about 5.3. A static-dissipative material is defined as a material having a surface resistance (SR) from $1 \times 10^5$ ohm to $1 \times 10^{11}$ ohm as defined by the International Electro-technical Commission (IEC) 61340-5-1. A static-dissipative material is difficult to charge and its charge transfer speed is not high making it an ideal material for ESD sensitive applications.

The socket structure 10 may further comprise an annular socket base 150 for precision plunger alignment. According to an embodiment of the present invention, the socket base 150 is mounted and secured on the upper surface 102S of the annular perimeter structure 102 of the socket housing 100. According to an embodiment of the present invention, the socket base 150 comprises a central through hole 150p that allows the passage of the DUT 130 and a lower portion of the plunger assembly 20 that vacuum grips the DUT 130 and places the DUT 130 to the test site on the socket structure 10. According to an embodiment of the present invention, the socket base 150 may comprise an inner portion 151 around the upper surface 102S of the annular perimeter structure 102 of the socket housing 100. According to an embodiment of the present invention, the socket base 150 may be made of monolithic anti-static materials including, but not limited to, anti-static FR4 having a dielectric constant of about 4.37, but is not limited thereto. According to an embodiment of the present invention, the socket base 150 may comprise absorber materials to avoid or mitigate signal coupling.

Figure 2:
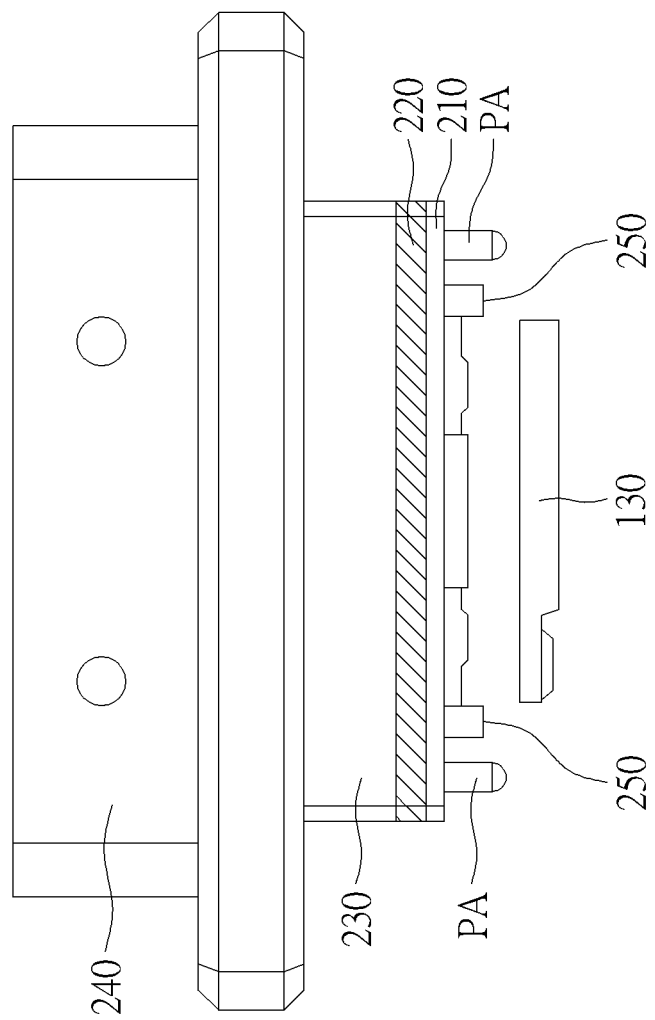
FIG. 2 is a schematic side view of the plunger assembly in FIG. 1 according to an embodiment of the invention.
Figure 3:
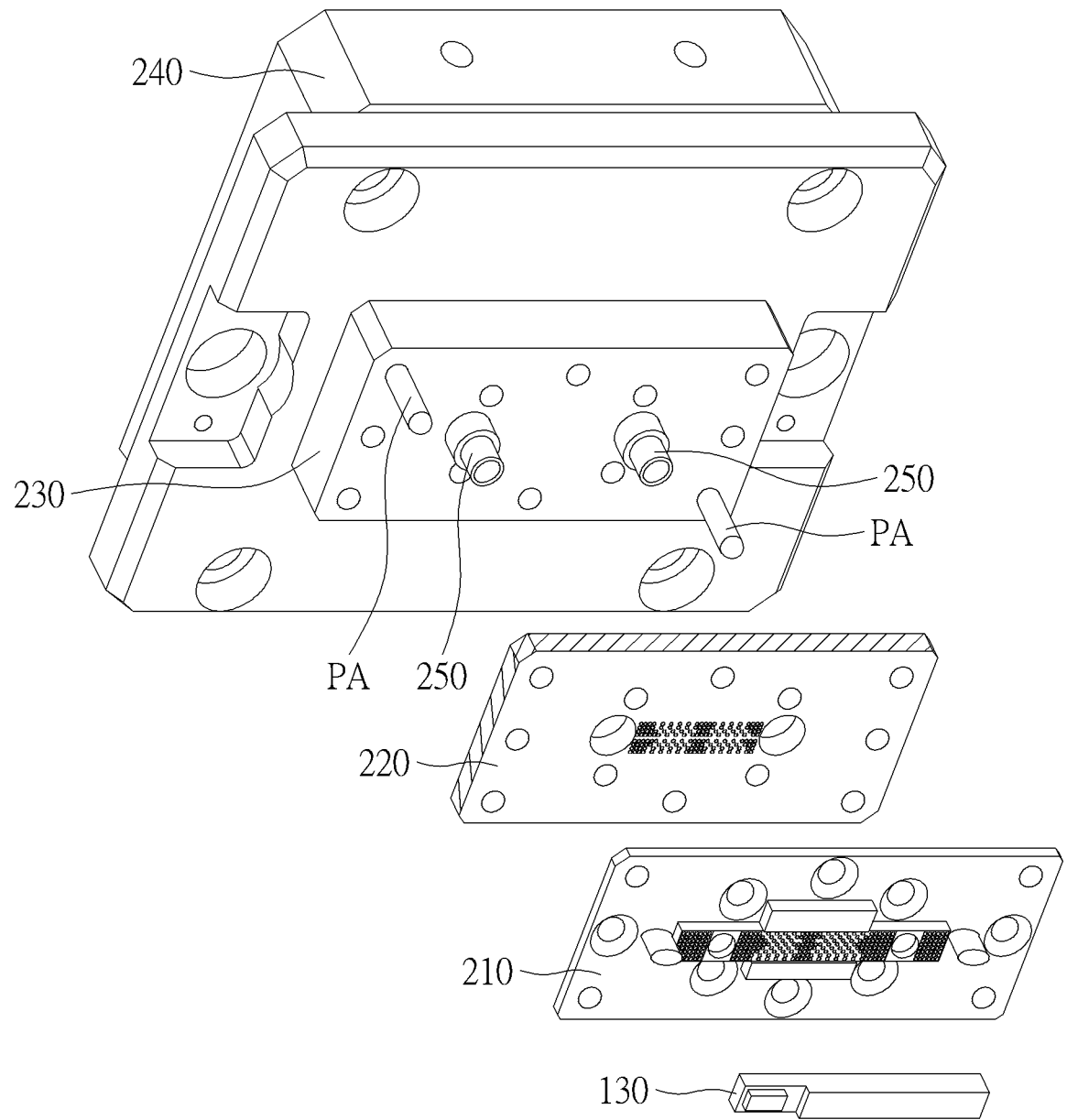
FIG. 3 is an exploded view of the plunger assembly in FIG. 2.

Please also refer to FIG. 2 and FIG. 3. FIG. 2 is a schematic side view of the plunger assembly in FIG. 1 according to an embodiment of the invention. FIG. 3 is an exploded view of the plunger assembly in FIG. 2. As shown in FIG. 2 and FIG. 3, and briefly FIG. 1, the plunger assembly 20 generally comprises a multi-layered structure including, but not limited to, a top socket 210, an interposer substrate 220, a nest 230, and a pressing member 240. The interposer substrate 220 is sandwiched by the top socket 210 and the nest 230.

The top socket 210 has high precision positioning capabilities when picking up the DUT 130. As can be seen in FIG. 1, the top socket 210 is embedded with a plurality of metal pogo pins P4 for mechanically and electrically connecting the contact pads on the DUT 130 to the interposer substrate 220. The top socket 210 helps to ensure that the contact pads on both sides of the DUT 130 are precisely contacted with the pogo pins P1~P3 and P4, respectively.

Figure 4:
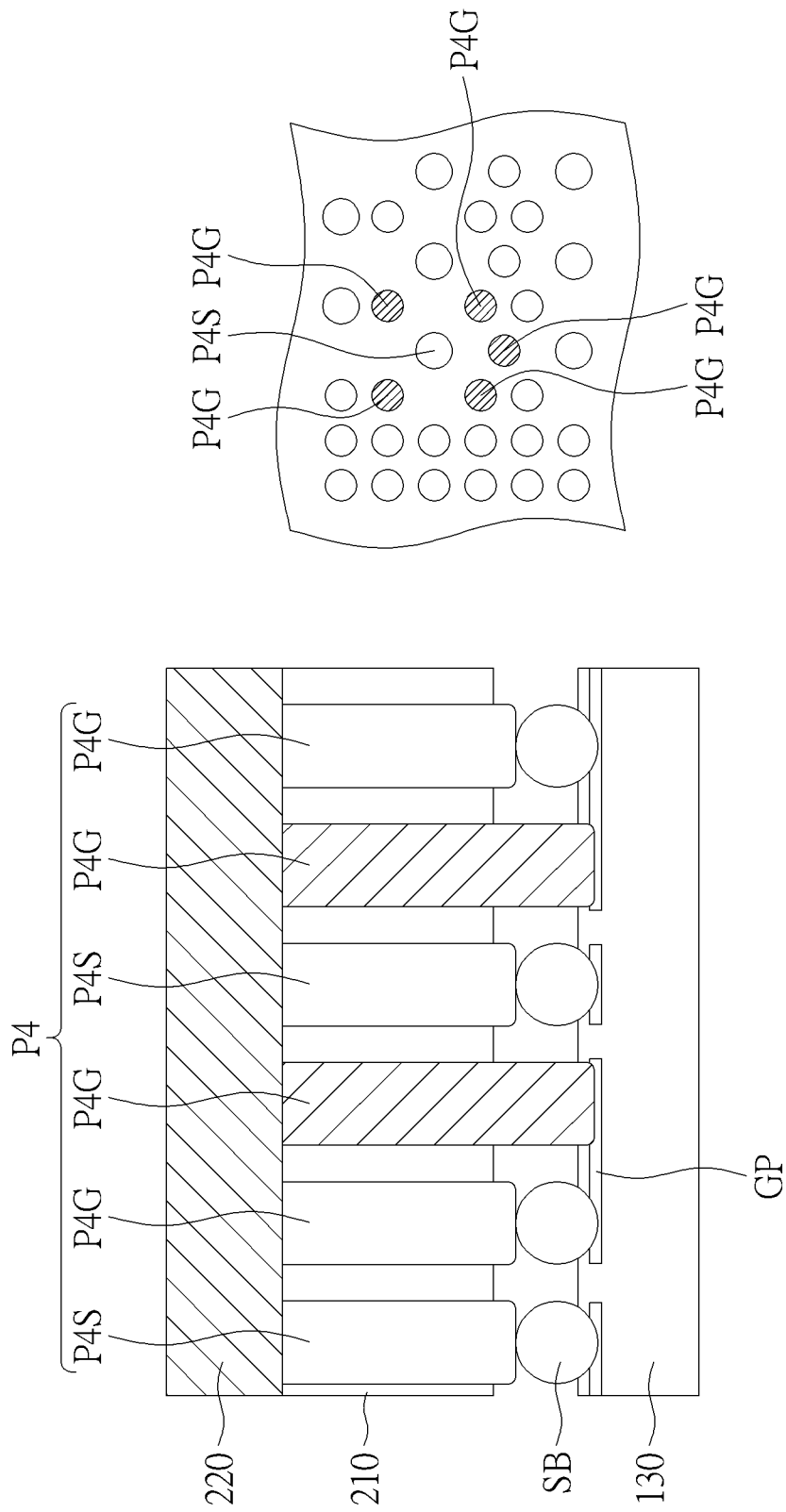
FIG. 4 shows a partial layout of the pogo pins and a partial sectional view of the top socket according to an embodiment of the present invention.
Figure 5:
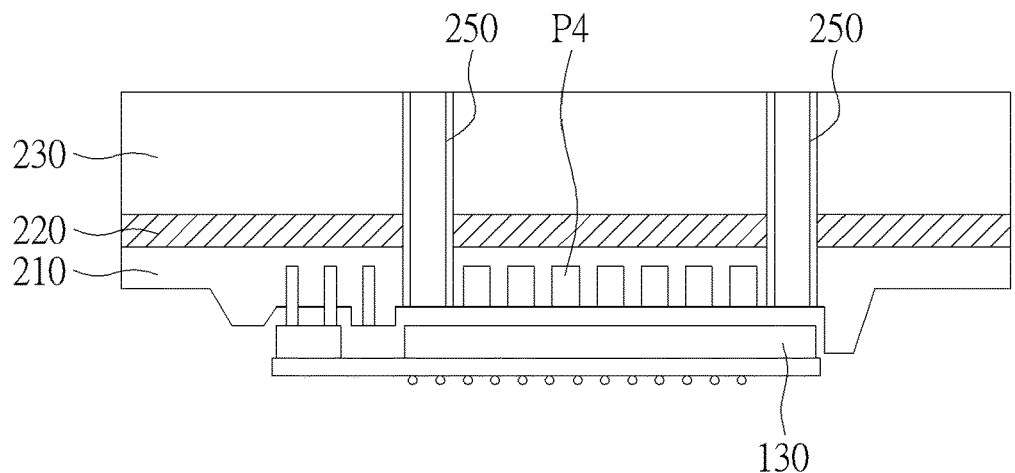
FIG. 5 shows various types of the top socket adapted for different types of DUT according to some embodiments of the invention.
Figure 5:
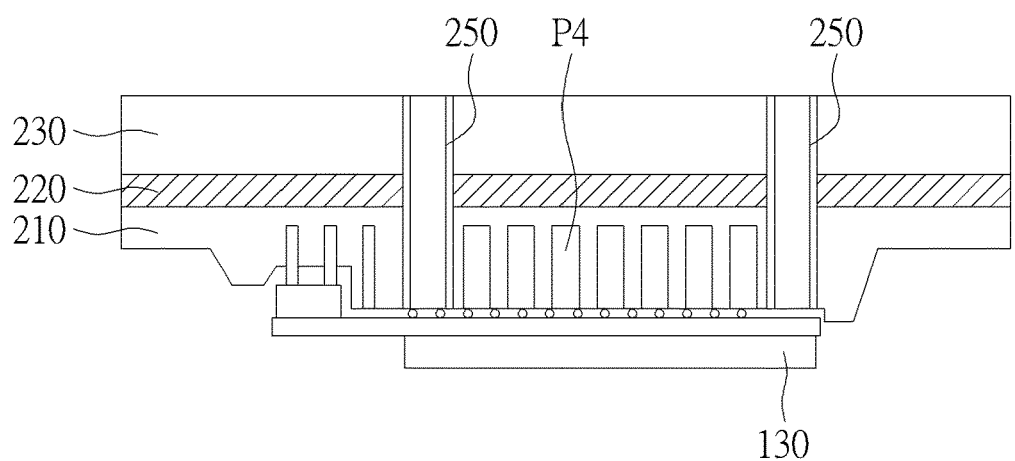
Figure 5:
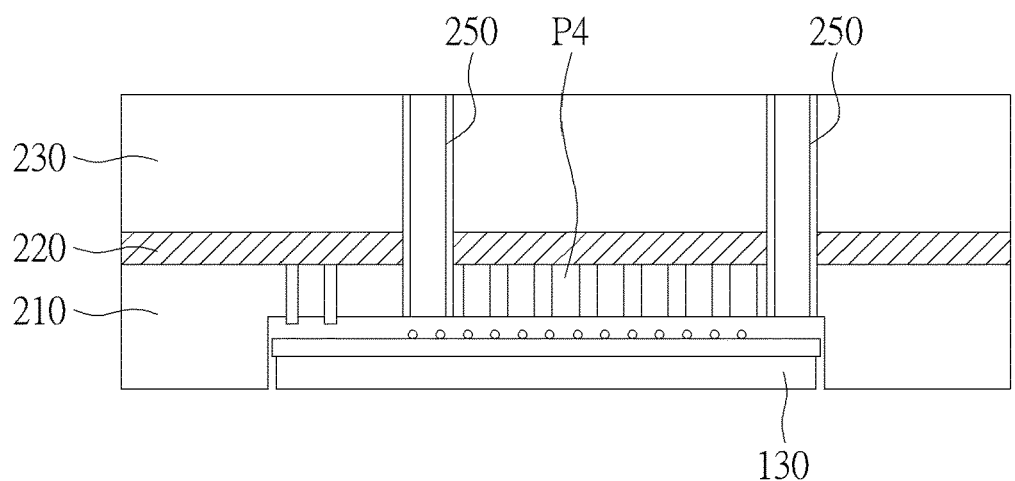

Please also refer to FIG. 4. FIG. 4 shows a partial layout of the pogo pins P4 and a partial sectional view of the top socket 210. At least one RF signal pin P4S is surrounded by a plurality of ground pins P4G. For example, in FIG. 4, one RF signal pin P4S is surrounded by five ground pins P4G. The ground pins P4G may be contacted to a ground plane GP of the a circuit board or substrate of the DUT 130 or corresponding solder balls SB that are electrically connected to the ground plane GP. By providing such configuration, the isolation between two adjacent RF signal pins P4S can be improved. In addition, the sizes or dimensions and the positions of the pogo pins P4 can be adjusted to achieve good impedance control without the need of changing package ball map. Please also refer to FIG. 5. FIG. 5 shows various types of the top socket adapted for different types of DUT according to some embodiments of the invention, wherein like layers, elements or regions are designated by like numeral numbers or labels. The top socket 210 can be easily changed to adapt different configurations of the DUT 130 such as different types of antenna-in-package (AiP) operated at mmW frequencies.

According to an embodiment of the present invention, the interposer substrate 220 may be a printed circuit board comprising signal traces or testing circuits, which provide mmW signal loopback during testing process. The mmW signals loop back in a relatively shorter signal transmitting path between transmitting terminal and receiving terminal of the DUT 130 without the need of extending signal out to the tester or load board 30, thereby reducing transition loss, parasitic effect and improving mmW signal performance. Depending upon design requirements, different digital and/or analog and/or RF circuit layouts and different components can be provided on the interposer substrate 220. For example, the interposer substrate 220 may comprises a coupler circuit for coupling signals or changing signal power ratio, an attenuator circuit for increasing the isolation, a divider circuit for port reduction, and/or a terminator circuit for reducing signal reflection, but not limited thereto.

By incorporating the interposer substrate 220 between the top socket 210 and the nest 230 of the plunger assembly 20, the tolerance of circuit wires can be reduced, the excessive loss at mmW frequencies can be avoided (due to the shorter length of signal transmission path), and the test costs including test instruments and test elements can be reduced.

According to an embodiment of the present invention, the nest 230 may be made of ESD control materials or static-dissipative materials including, but not limited to, PEEK having a dielectric constant of about 3.3, but is not limited thereto. According to an embodiment of the present invention, the nest 230 has an upper side 230a and a lower side 230b. During the testing process, the lower side 230b of the nest 230 is engaged and in direct contact with the inner portion 151 of the socket base 150. According to an embodiment of the present invention, the nest 230 may comprise absorber materials to avoid or mitigate signal coupling.

According to an embodiment of the present invention, the pressing member 240 may be coupled to the upper side 230a of the nest 230. According to an embodiment of the present invention, the pressing member 240 may be made of metal, but is not limited thereto. The pressing member 240 locks the nest 230 to layout kit part. According to an embodiment of the present invention, the pressing member 240 may be mechanically connected to a robot arm or an automated handler H. The automated handler H associated with ATE system may moves the DUT 130 from a shipping tray (not shown) onto the socket structure 10 that is mounted on the load board 30.

According to an embodiment of the present invention, the nest 230 is coupled to at least one nozzle 250 for vacuum gripping and/or holding the DUT 130 in the guide plate 120 mounted in the socket housing 100. For illustration purposes, two nozzles 250 are illustrated in FIG. 1. The two nozzles 250 protrude from a bottom surface of the nest 230 and are inserted into the corresponding apertures of the underlying interposer substrate 220 and the top socket 210. The nest 230 is also coupled to two alignment pins PA that protrude from bottom surface of the nest 230 at diagonal positions and are inserted into the corresponding apertures of the underlying interposer substrate 220 and the top socket 210. During testing, as shown in FIG. 1, the alignment pins PA are inserted into corresponding positioning holes in the socket housing 100. According to an embodiment of the present invention, for example, the nozzles 250 may be made of ESD control materials or static-dissipative materials including, but not limited to, ESD420 having a dielectric constant of about 5.63, but is not limited thereto. According to an embodiment of the present invention, the nozzles 250 may be used to pick and place the DUT 130 in the socket structure 10. According to an embodiment of the present invention, the nozzles 250 may be used to press the DUT 130 in position during the testing process. According to an embodiment of the present invention, the nozzles 250 may be used to provide coupling factor tuning with different shapes and sizes.

According to an embodiment of the present invention, the nozzles 250 may communicate with a connecting chamber 230c between the nest 230 and the pressing member 240, which is further connected to a vacuum conduit 220c. According to an embodiment of the present invention, for example, a vacuum seal 242 such as a rubber O-ring may be provided around the vacuum conduit 240c and a vacuum seal 232 such as a rubber O-ring may be provided around the connecting chamber 230c. According to an embodiment of the present invention, for example, the vacuum seal 232 and the vacuum seal 242 may be made of heat-resistance materials. During the testing process, a testing enclosure TE is defined approximately between the top socket 210 and the guide plate 120. The previously mentioned test method for testing the DUT 130 may be implemented within the testing enclosure TE.

Figure 6:
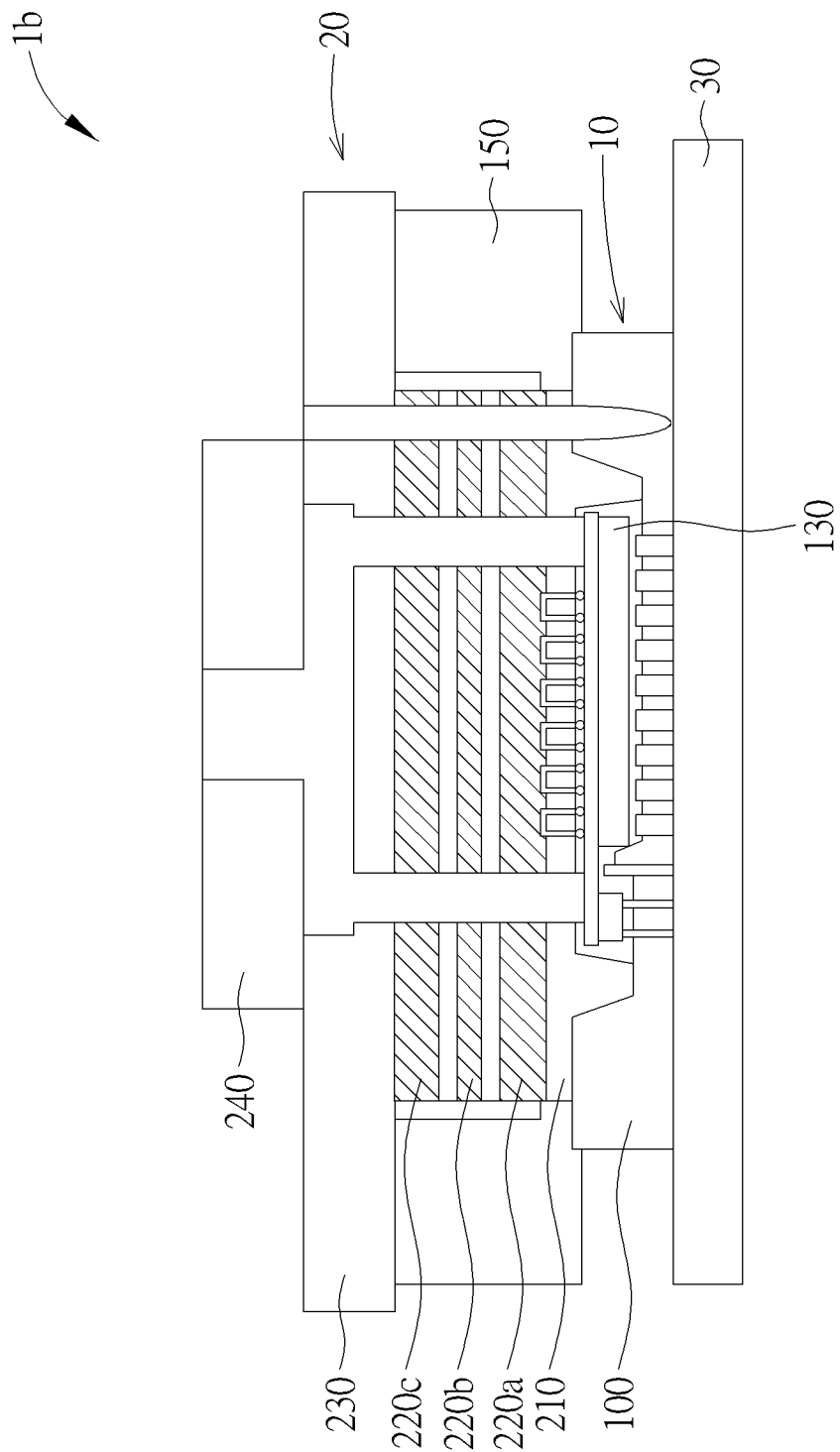
FIG. 6 is a schematic diagram showing a test kit for testing a DUT according to another embodiment of the present invention.

FIG. 6 is a schematic diagram showing a test kit for testing a DUT according to another embodiment of the present invention. As shown in FIG. 6, the plunger assembly 20 of the test kit 1b may comprise multiple interposer substrates 210a~210c. For example, the interposer substrates 210a~210c may comprise different circuits comprising a coupler circuit for coupling signals or changing signal power ratio, an attenuator circuit for increasing the isolation, a divider circuit for port reduction, or a terminator circuit for reducing signal reflection.

Figure 7:
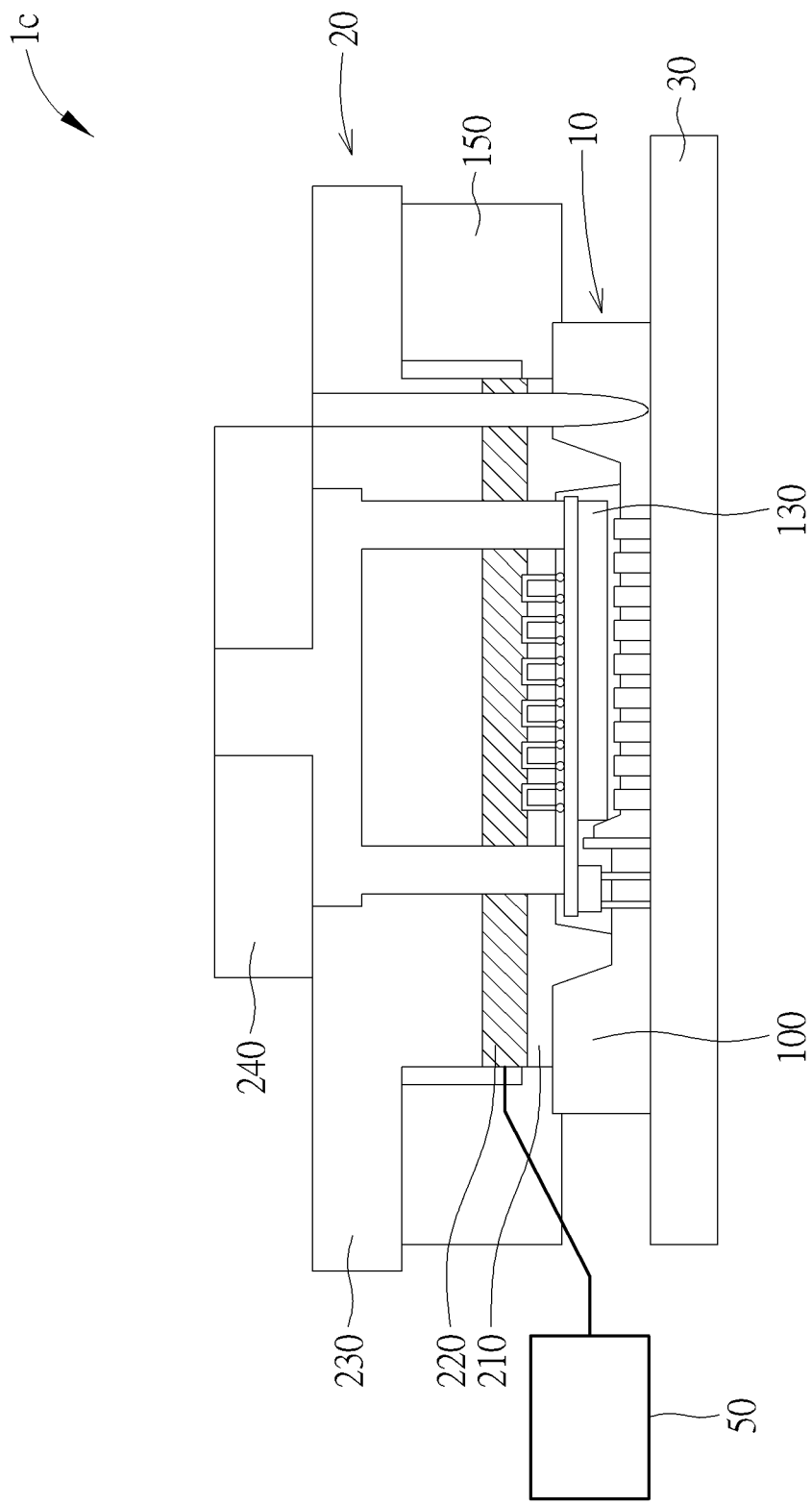
FIG. 7 is a schematic diagram showing a test kit for testing a DUT according to still another embodiment of the present invention.

FIG. 7 is a schematic diagram showing a test kit for testing a DUT according to still another embodiment of the present invention. As shown in FIG. 7, the interposer substrate 220 of the test kit 1c may be electrically connected to a signal analyzer 50 to measure the signal performance.

Figure 8:
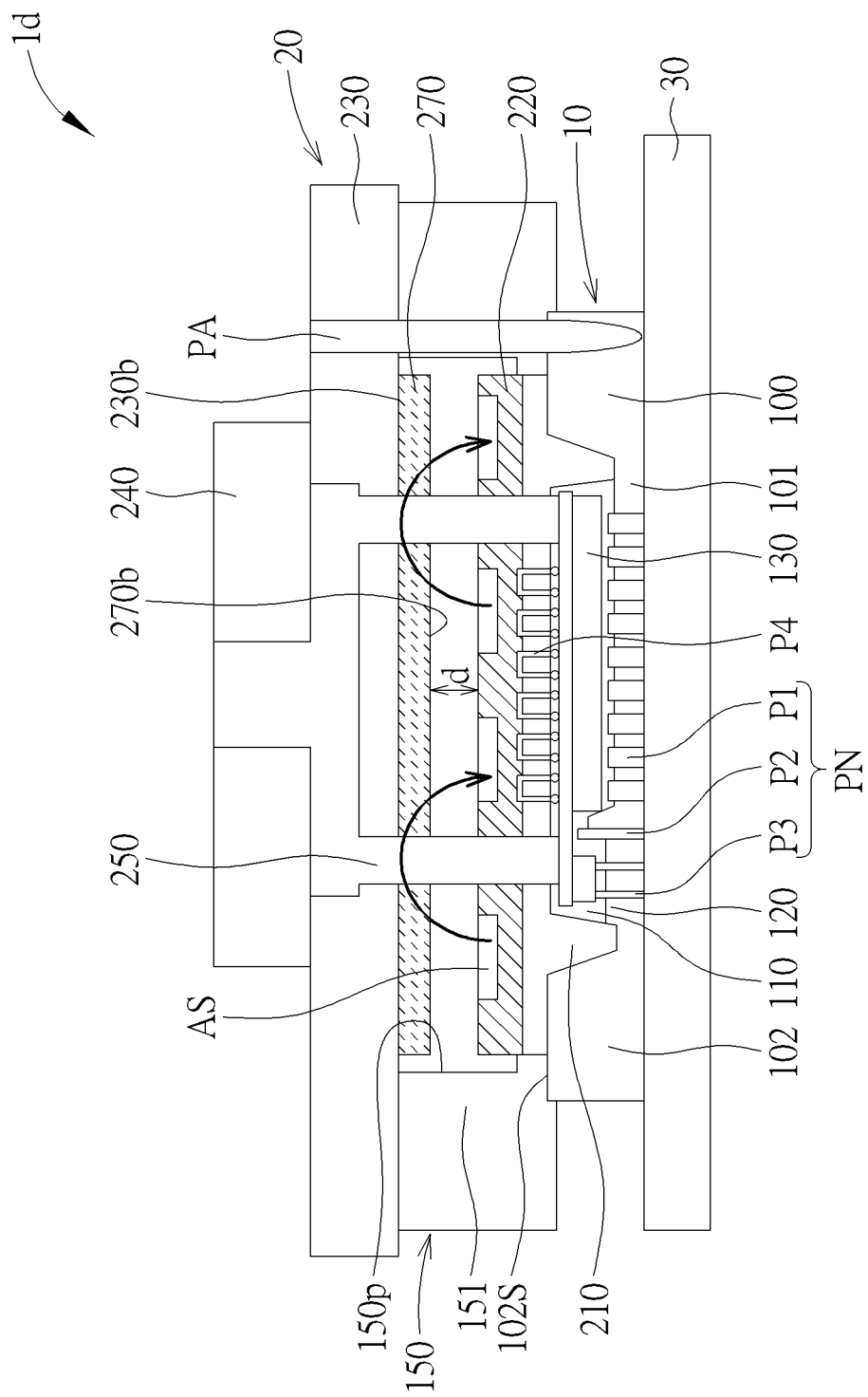
FIG. 8 is a schematic diagram showing a test kit for testing a DUT according to yet another embodiment of the present invention.

FIG. 8 is a schematic diagram showing a test kit for testing a DUT according to yet another embodiment of the present invention, wherein like layers, elements, or regions are designated by like numeral numbers or labels. As shown in FIG. 8, likewise, the test kit 1d comprises a socket structure 10 and a plunger assembly 20 detachably coupled with the socket structure 10. According to an embodiment of the present invention, the socket structure 10 may comprise a socket housing 100 secured to a load board 30 such as a printed wiring board or a printed circuit board. The load board may include a PCB having a DUT side 30a and a non-DUT side 30b. A DUT 130 is insertable to the socket structure 10 on the DUT side 30a.

According to an embodiment of the present invention, the socket housing 100 may be made of monolithic anti-static materials including, but not limited to, durable high-performance polyimide-based plastics, such as SP1+ (DuPont™) having a dielectric constant ($D_k$) of about 3.5, but is not limited thereto. According to an embodiment of the present invention, the socket housing 100 may comprise a plate-shaped base portion 101 integrated with a pin assembly PN including, but not limited to, pogo pins P1, conductive pins P2 and conductive pins P3. The conductive pins P2 and P3 may extend from the socket housing 100 and penetrate through corresponding through holes formed on the base portion 101 for transmitting signals. According to an embodiment of the present invention, the base portion 101 functions as an interface between the load board 30 and the DUT 130. According to an embodiment of the present invention, the pin assembly PN may comprise at least two different types and lengths of pogo pins.

According to an embodiment of the present invention, the socket housing 100 may comprises an annular perimeter structure 102 surrounding the base portion 101, thereby forming a cavity 110 defined by an inner sidewall of the annular perimeter structure 102 and an upper surface of the base portion 101. According to an embodiment of the present invention, the annular perimeter structure 102 is formed integrally with the base portion 101. According to an embodiment of the present invention, the annular perimeter structure 102 has a thickness that is greater than a thickness of the base portion 101. According to another embodiment of the present invention, the socket housing 100 may be in direct contact with the load board 30. However, the socket housing 100 may be partially removed while the socket housing 100 is overlapping any high frequency signal traces on the load board 30. According to an embodiment of the present invention, an electrically floating guide plate 120 for guiding and adjusting the position and/or rotation angles of the DUT 130 may be fittingly mounted within the cavity 110. The guide plate 120 may be in direct contact with the socket housing 100.

According to an embodiment of the present invention, the guide plate 120 may be made of monolithic ESD control materials or static-dissipative materials to prevent the DUT 130 from being damaged under high electrostatic voltages during the testing process. For example, the aforesaid ESD control materials or static-dissipative materials may include, but not limited to, PEEK-based plastics, such as EKH-SS11 (Krefine®) having a dielectric constant of about 5.3. A static-dissipative material is defined as a material having a surface resistance (SR) from $1 \times 10^5$ ohm to $1 \times 10^{11}$ ohm as defined by the International Electro-technical Commission (IEC) 61340-5-1. A static-dissipative material is difficult to charge and its charge transfer speed is not high making it an ideal material for ESD sensitive applications.

The socket structure 10 may further comprise an annular socket base 150 for precision plunger alignment. According to an embodiment of the present invention, the socket base 150 is mounted and secured on the upper surface 102S of the annular perimeter structure 102 of the socket housing 100. According to an embodiment of the present invention, the socket base 150 comprises a central through hole 150p that allows the passage of the DUT 130 and a lower portion of the plunger assembly 20 that vacuum grips the DUT 130 and places the DUT 130 to the test site on the socket structure 10. According to an embodiment of the present invention, the socket base 150 may comprise an inner portion 151 around the upper surface 102S of the annular perimeter structure 102 of the socket housing 100. According to an embodiment of the present invention, the socket base 150 may be made of monolithic anti-static materials including, but not limited to, anti-static FR4 having a dielectric constant of about 4.37, but is not limited thereto. According to an embodiment of the present invention, the socket base 150 may comprise absorber materials to avoid or mitigate signal coupling.

According to an embodiment of the present invention, the plunger assembly 20 generally comprises a multi-layered structure including, but not limited to, a top socket 210, an interposer substrate 220, a nest 230, a pressing member 240, and a reflector 270 disposed between the interposer substrate 220 and the nest 230.

According to an embodiment of the present invention, the top socket 210 has high precision positioning capabilities when picking up the DUT 130. The top socket 210 is embedded with a plurality of metal pogo pins P4 for mechanically and electrically connecting the contact pads on the DUT 130 to the interposer substrate 220. The top socket 210 helps to ensure that the contact pads on both sides of the DUT 130 are precisely contacted with the pogo pins P1~P3 and P4, respectively.

According to an embodiment of the present invention, the interposer substrate 220 may be a printed circuit board comprising signal traces or testing circuits. Depending upon design requirements, different digital and/or analog and/or RF circuit layouts and different components can be provided on the interposer substrate 220. For example, the interposer substrate 220 may comprises a coupler circuit for coupling signals or changing signal power ratio, an attenuator circuit for increasing the isolation, a divider circuit for port reduction, and/or a terminator circuit for reducing signal reflection, but not limited thereto. According to an embodiment of the present invention, the interposer substrate 220 further comprises an antenna structure AS on its top side that directly faces the reflector 270.

According to an embodiment of the present invention, the reflector 270 is secured to a bottom surface 230b of the nest 230. According to an embodiment of the present invention, the reflector 270 may be composed of a metal, a metal alloy, or any suitable conductive materials. According to an embodiment of the present invention, the reflector 270 is spaced a predetermined distance d apart from the interposer substrate 220. The reflection distance d between a lower surface 270b of the reflector 270 and the antenna AS of the interposer substrate 220 can be adjusted in order to control the receiving energy and keep impedance matching. According to an embodiment of the present invention, for example, the reflection distance d may preferably range between about 0.25λ and multiple of this length, wherein λ is the wavelength (mm) of the RF signal with the lowest frequency in operation band. For example, for the RF signal with frequency of 24.5 GHz, λ is 12.4 mm, and therefore the reflection distance D ranges between 3.1 mm and 9.3 mm. The RF signal can be transferred from one antenna to an adjacent antenna by the reflection of the reflector 270 such that a non-conductive loopback test can be implemented in the plunger assembly 20.

According to an embodiment of the present invention, likewise, the nest 230 may be made of ESD control materials or static-dissipative materials including, but not limited to, PEEK having a dielectric constant of about 3.3, but is not limited thereto. According to an embodiment of the present invention, the nest 230 may comprise absorber materials to avoid or mitigate signal coupling. According to an embodiment of the present invention, the pressing member 240 may be coupled to the nest 230 using means known in the art. According to an embodiment of the present invention, the pressing member 240 may be made of metal, but is not limited thereto. The pressing member 240 locks the nest 230 to layout kit part. According to an embodiment of the present invention, the nest 230 is coupled to at least one nozzle 250 for vacuum gripping and/or holding the DUT 130. The nest 230 is also coupled to two alignment pins PA that protrude from bottom surface of the nest 230 at diagonal positions and are inserted into the corresponding apertures of the underlying reflector 270, the interposer substrate 220 and the top socket 210. During testing, as shown in FIG. 1, the alignment pins PA are inserted into corresponding positioning holes in the socket housing 100. According to an embodiment of the present invention, for example, the nozzles 250 may be made of ESD control materials or static-dissipative materials including, but not limited to, ESD420 having a dielectric constant of about 5.63, but is not limited thereto. According to an embodiment of the present invention, the nozzles 250 may be used to pick and place the DUT 130 in the socket structure 10. According to an embodiment of the present invention, the nozzles 250 may be used to press the DUT 130 in position during the testing process. According to an embodiment of the present invention, the nozzles 250 may be used to provide coupling factor tuning with different shapes and sizes.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A test kit for testing a device under test (DUT), comprising:
   a socket structure, for containing the DUT; and
   a plunger assembly detachably coupled with the socket structure, wherein the plunger assembly comprises a multi-layered structure comprising at least an interposer substrate sandwiched by a top socket and a nest, wherein the socket structure comprises a bottom socket and an annular socket base secured to a top surface of the bottom socket, wherein the annular socket base surrounds perimeter of the interposer substrate and the top socket.

2. The test kit for testing a DUT according to claim 1, wherein the plunger assembly further comprises a pressing member coupled to an upper side of the nest.

3. The test kit for testing a DUT according to claim 2, wherein the pressing member is made of metal.

4. The test kit for testing a DUT according to claim 1, wherein the socket base comprises a central through hole that allows passage of the DUT and a lower portion of the plunger assembly that vacuum grips the DUT and places the DUT to test site on the socket structure.

5. The test kit for testing a DUT according to claim 4, wherein the socket base comprises an inner portion around an upper surface of the bottom socket, and wherein a lower portion of the nest is engaged and in direct contact with the inner portion of the socket base.

6. The test kit for testing a DUT according to claim 1, wherein the nest is made of an electrostatic-discharge (ESD) control material or a static-dissipative material.

7. The test kit for testing a DUT according to claim 2 further comprising:
   at least one nozzle for vacuum gripping or holding the DUT, wherein the at least one nozzle penetrates through the nest, the interposer substrate and the top socket.

8. The test kit for testing a DUT according to claim 7, wherein the at least one nozzle communicates with a connecting chamber disposed between the nest and the pressing member.

9. The test kit for testing a DUT according to claim 1, wherein the top socket comprises a plurality of pogo pins for electrically connecting the interposer substrate to the DUT.

10. A test kit for testing a device under test (DUT), comprising:
    a socket structure, for containing the DUT; and
    a plunger assembly detachably coupled with the socket structure, wherein the plunger assembly comprises a multi-layered structure comprising a top socket, at least an interposer substrate mounted on the top socket, a nest, and a reflector disposed between the interposer substrate and the nest, wherein the socket structure comprises a bottom socket and an annular socket base secured to a top surface of the bottom socket, wherein the annular socket base surrounds perimeter of the interposer substrate and the top socket.

11. The test kit for testing a DUT according to claim 10, wherein the interposer substrate comprises an antenna structure on its top side that directly faces the reflector.

12. The test kit for testing a DUT according to claim 11, wherein the reflector is spaced a distance d apart from the interposer substrate.

13. The test kit for testing a DUT according to claim 11, wherein a radio frequency (RF) signal can be transferred from one antenna to an adjacent antenna of the antenna structure via reflection of the reflector such that a non-conductive loopback test is implemented in the plunger assembly.

14. The test kit for testing a DUT according to claim 10, wherein the reflector is composed of a conductive material.

15. The test kit for testing a DUT according to claim 10, wherein the plunger assembly further comprises a pressing member coupled to an upper side of the nest.

16. The test kit for testing a DUT according to claim 15, wherein the pressing member is made of metal.

17. The test kit for testing a DUT according to claim 10, wherein the socket base comprises a central through hole that allows passage of the DUT and a lower portion of the plunger assembly that vacuum grips the DUT and places the DUT to test site on the socket structure.

18. The test kit for testing a DUT according to claim 17, wherein the socket base comprises an inner portion around an upper surface of the bottom socket, and wherein a lower portion of the nest is engaged and in direct contact with the inner portion of the socket base.

19. The test kit for testing a DUT according to claim 10, wherein the nest is made of an electrostatic-discharge (ESD) control material or a static-dissipative material.

20. The test kit for testing a DUT according to claim 10 further comprising:
   at least one nozzle for vacuum gripping or holding the DUT, wherein the at least one nozzle penetrates through the nest, the reflector, the interposer substrate and the top socket.

21. The test kit for testing a DUT according to claim 10, wherein the top socket comprises s a plurality of pogo pins for electrically connecting the interposer substrate to the DUT.

\* \* \* \* \*